United States Patent

(12) United States Patent
Ho

(10) Patent No.: US 7,864,569 B2
(45) Date of Patent: Jan. 4, 2011

(54) STRUCTURE OF MAGNETIC RANDOM ACCESS MEMORY USING SPIN-TORQUE TRANSFER WRITING

(75) Inventor: Chiahua Ho, Hsinchu County (TW)

(73) Assignee: MACRONIX International Co., Ltd., Hsinchu (TW)

(*) Notice: Subject to any disclaimer, the term of this patent is extended or adjusted under 35 U.S.C. 154(b) by 195 days.

(21) Appl. No.: 11/607,612

(22) Filed: Dec. 1, 2006

(65) Prior Publication Data

US 2008/0130354 A1  Jun. 5, 2008

(51) Int. Cl.
*G11C 11/14* (2006.01)

(52) U.S. Cl. .............. 365/171; 257/E21.665; 438/3

(58) Field of Classification Search .......... 257/9, 257/E21.665; 365/171, 173; 338/32 R; 438/3
See application file for complete search history.

(56) References Cited

U.S. PATENT DOCUMENTS

| | | | |
|---|---|---|---|
| 6,266,218 B1* | 7/2001 | Carey et al. | 360/324.12 |
| 2004/0061154 A1* | 4/2004 | Huai et al. | 257/295 |
| 2005/0282295 A1* | 12/2005 | Raberg | 438/3 |
| 2006/0077707 A1* | 4/2006 | Deak | 365/171 |
| 2006/0227465 A1* | 10/2006 | Inokuchi et al. | 360/324.1 |

OTHER PUBLICATIONS

Integrated Publishing, Electrical Engineering Training Series, "Lines of Force", http://www.tpub.com/neets/book1/chapter1/1i.htm, orginally publsihed on Dec. 14, 2000 (see www.archive.org).*
Hosomi et al., A Novel Nonvolatile Memory with Spin Torque Transfer Magnetization Switching: Spin-RAM, 4 pgs., (2005).
Jeong et al., Highly Scalable MRAM Using Field Assisted Current Induced Switching, Symposium on VLSI Technology Digest of Technical Papers, 184-185, (2005).

* cited by examiner

*Primary Examiner*—Thao X Le
*Assistant Examiner*—Robert Huber
(74) *Attorney, Agent, or Firm*—Jianq Chyun IP Office

(57) ABSTRACT

A nano-magnetic device includes a first hard magnet having a first magnetization direction and having a central axis. The device also includes a second hard magnet separated from the first hard magnet by a dielectric liner. The second hard magnet has a second magnetization direction opposite to the first magnetization direction of the first hard magnet, and a central axis, such that when the first hard magnet and the second hard magnet are aligned a closed magnetic flux loop is formed through the first and second hard magnets. The device additionally includes a ferromagnetic free layer having a central axis. A spin-torque transfer current passes along the central axes of the first and second hard magnets and the ferromagnetic free layer, and affects the magnetization direction of the ferromagnetic free layer.

11 Claims, 4 Drawing Sheets

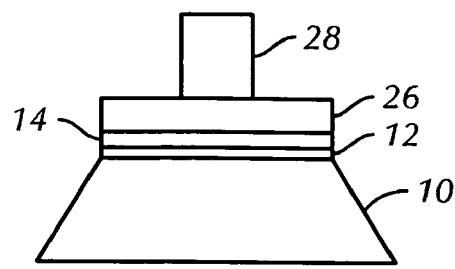
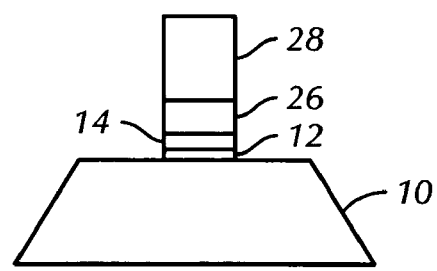
FIG. 6  FIG. 7
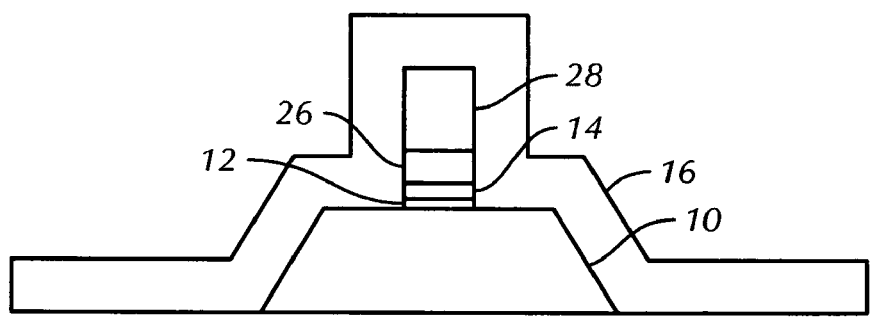
FIG. 8
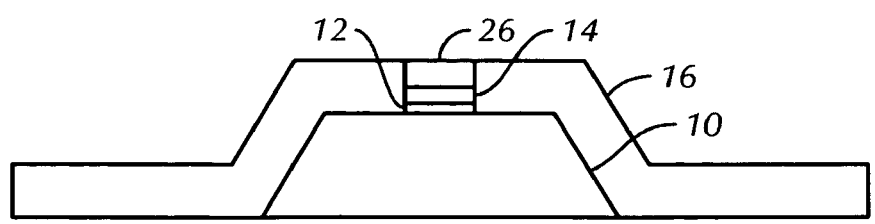
FIG. 9

STRUCTURE OF MAGNETIC RANDOM ACCESS MEMORY USING SPIN-TORQUE TRANSFER WRITING

BACKGROUND OF THE INVENTION

The present invention relates generally to magnetic random access memory devices, and more particularly, a novel structure for a magnetic random access memory device that is programmed by spin torque transfer, and a method for making the structure.

Conventional non-volatile magnetic random access memory (MRAM) devices are operated by using cross-point magnetic field switching. A field is generated by a current through bit lines arranged above and below the device. A ferromagnetic free layer in the device, serving as the writable plate, has a coercivity field that is smaller than the magnetic field generated by the bit lines. As a result, the magnetization direction of the ferromagnetic free layer is altered to align with the magnetic field direction. However, this operation method limits the ability to scale down the MRAM device because a large current is required. When a plurality of devices are arranged in an MRAM array, the operation additionally has a problem of write disturbance because the magnetic field of one device also affects the ferromagnetic free layer of neighboring MRAM devices.

On the other hand, an MRAM device may also use a method called spin-torque transfer for write operations. The operation depends on a current density flowing through a magnetic tunnel junction (MTJ) stack rather than current amplitude. The MTJ stack is composed essentially of a ferromagnetic free layer and a reference layer having a fixed magnetization direction. Electrons pass through the reference layer and are spin polarized. As the electrons flow from the reference layer through the ferromagnetic free layer, the electrons gradually change the magnetization direction of the ferromagnetic free layer based on a tuning of the precessing and damping terms of the Landau-Lifshitz-Gilbert (LLG) equation. Additionally, by using a spin-torque transfer current through the MTJ stack, the cell being programmed may be written without disturbance. This enables self-writing, i.e., no additional bit line is required for writing contribution. As a result, the MRAM devices may be scaled down even further.

The MTJ stack may also utilize a second reference layer. The second layer has a magnetization direction opposite to that of the first reference layer. The subsequent magnetization direction of the free layer is thus determined by the direction of the flow of electrons through the memory device during the write operation. For example, for a current flowing through the first reference layer to the second reference layer, the magnetization direction of the free layer is aligned to that of the first reference magnet.

The spin torque transfer current density required strongly depends on the size of the MTJ stack. However, as the MTJ stack becomes smaller, the device suffers from memory information loss caused by superparamagnetism. Since high writing current densities are required to effect the change in the free layer, thermal energy becomes substantial enough to cause the atomic magnetic moments in the material to fluctuate randomly. This phenomenon contributes not only to destabilization of the ferromagnetic free layer, but to destabilization of the reference magnets as well. The problem of write disturbance in the MRAM arrays also persists. It is therefore desirable to use an MRAM device which requires a lower writing current density and which is capable of maintaining a stable magnetic state in both the device itself and the array.

BRIEF SUMMARY OF THE INVENTION

A first embodiment of the present invention includes a nano-magnetic device. The device includes a first hard magnet having a first magnetization direction and having a central axis. The device also includes a second hard magnet separated from the first hard magnet by a dielectric liner. The second hard magnet has a second magnetization direction opposite to the first magnetization direction of the first hard magnet, and a central axis, such that when the first hard magnet and the second hard magnet are aligned a closed magnetic flux loop is formed through the first and second hard magnets. The device additionally includes a ferromagnetic free layer having a central axis. A spin-torque transfer current passes along the central axes of the first and second hard magnets and the ferromagnetic free layer, and affects the magnetization direction of the ferromagnetic free layer. A plurality of such devices may be connected to a chip so as to form an array for use in a magnetic random access memory.

Another embodiment of the present invention includes a method for preparing an apparatus for use in a nano-magnetic device. The apparatus requires a first hard magnet, a pillar, a subsequently deposited thin metal layer, and a subsequently deposited second hard magnet. The first magnet has a known first magnetization direction and a pillar shape. The pillar contains an insulator layer, a ferromagnetic free layer, a CMP stop layer, and a hard mask. The second hard magnet has a second magnetization direction opposite to the first magnetization direction of the first hard magnet. The method includes shrinking the hard mask, etching the pillar of the CMP stop layer, the ferromagnetic free layer, and the insulator layer to conform to the hard mask, and etching the second hard magnet and the thin metal layer in a pillar shape, such that the pattern is aligned to the first hard magnet shape.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

FIGS. 3-11 generally show a process for manufacturing an MRAM device in accordance with the preferred embodiment of the invention.

DETAILED DESCRIPTION OF THE INVENTION

Figure 1:
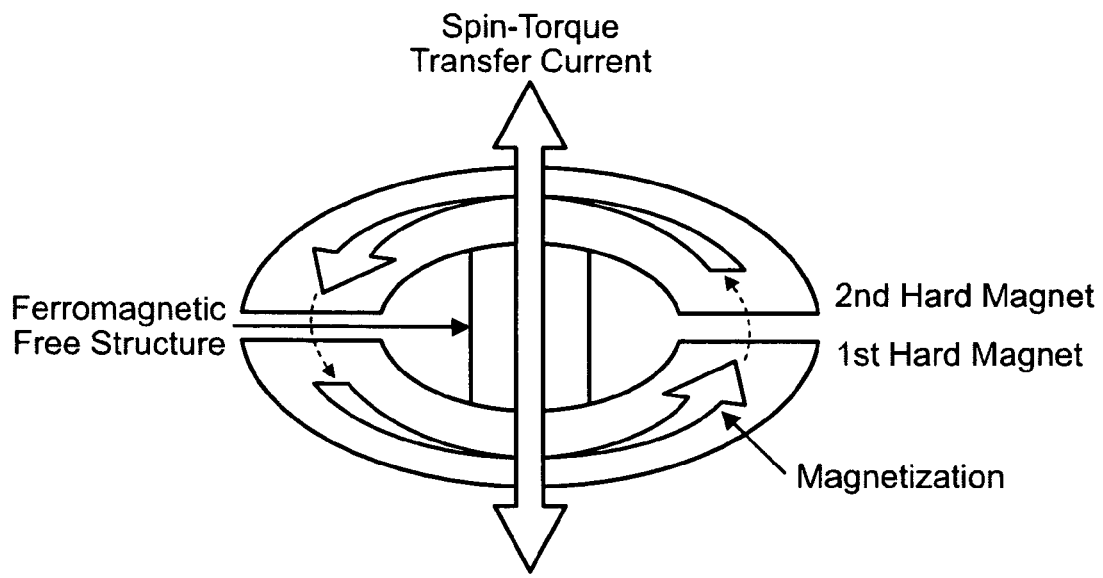
FIG. 1 shows a cross section of a basic structure of an embodiment of the present invention.

FIG. 1 shows a cross section of a basic structure of an embodiment of the present invention. During a write operation, a current pulse passes through the MRAM device structure from one hard magnet, through the ferromagnetic free structure, and through the second hard magnet. Current density ranges from about $10^5$ A/cm$^2$ to about $10^7$ A/cm$^2$, and pulse duration time ranges from about 0.1 ns to about 100 ns.

Unlike the prior art, where each layer is planar and of the same width as the other layers, FIG. 1 shows that the two hard magnets are much larger relative to the ferromagnetic free structure. This enables utilization of a lower current density for device programming. The current density required to alter the magnetization direction follows the equation:

$$J=J_{c0}[1-(KT/E)\ln(\tau_p/\tau_0)], \text{ where } E=M_s VH_k/2$$

$J_{c0}$, K (Boltzmann constant), and $\tau_0$ are constants. $\tau_p$ (pulse duration time), T (temperature), $M_s$ (saturation magnetization), V (device volume) and $H_k$ (anisotropic field) are variable parameters.

For the two larger hard magnets, the $H_k$ and V are high. A 1 μm width for both hard magnets requires a current density greater than $10^7$ A/cm$^2$ to change the magnetization direction. By contrast, the smaller ferromagnetic free structure has relatively lower $H_k$ and V. The required current density is on the order of $10^5$ or $10^6$ A/cm$^2$. Therefore, the proportionally larger volume of the two hard magnets enables a more stable device. Simultaneously, the smaller ferromagnetic free layer allows for the use of a lower current density, which further aids the device's magnetic stabilization.

Figure 2:
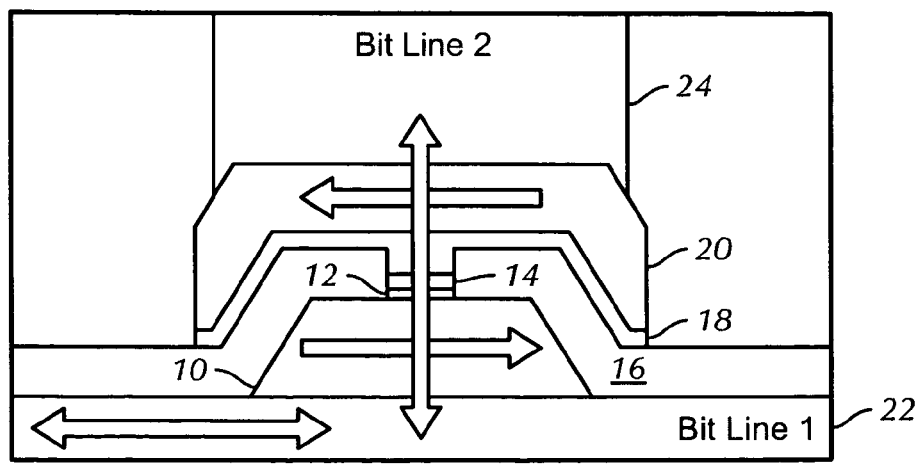
FIG. 2 shows a more detailed cross section of an embodiment of the present invention.

FIG. 2 shows a detailed cross section of an embodiment of the present invention as connected in an MRAM array to bit lines 22 and 24, which carry current pulses to perform MRAM writing. A first hard magnet 10 is connected to bit line 22, shown in FIG. 2 along an x-axis. The first hard magnet 10 may be constructed of a high coercivity material, including 3d transition ferromagnetic material or alloy such as CoFe or Co, a hard magnet material such as SmCo, or a mixed structure, for example, Co deposited on Cr. The coercivity ranges from about 100 Oe to about 1T (10,000 Oe).

Alternatively, the first hard magnet 10 may be constructed of an exchange-bias coupled ferromagnetic material. This includes ferromagnetic on antiferromagnetic structure. The antiferromagnetic material may be an antiferromagnetic substance such as FeMn, IrMn, or PtMn, a synthetic antiferromagnetic structure such as CoFe/Rr/CoFe, or a combination of the two. Regardless of the material used, the first hard magnet 10 should have a total thickness in the range of about 10 nm to about 200 nm.

An insulator layer 12 is shown in FIG. 2 above the central axis of first hard magnet 10. This structure includes material such as $Al_2O_3$ or MgO, and ranges in thickness from about 0.8 nm to about 4 nm. The insulator layer 12 separates the first hard magnet 10 from a ferromagnetic free structure 14. The ferromagnetic free structure 14 may be a single ferromagnetic layer such as CoFe, CoFeB, NiFeSiB, or NiFe, or may be a multilayer structure, for example, CoFeB/Ru/CoFeB. Each layer ranges in thickness from about 1 nm to about 10 nm. The coercivity of the ferromagnetic free layer 14 is lower than that of the first hard magnet 10, such as below 50 Oe.

A thin metal layer 18 is used to conduct the electron spin message from a second hard magnet 20 during writing and to prevent magnetic coupling between the ferromagnetic free layer 14 and the second hard magnet 20. This metal layer 18, which may consist of Ru, Ir, Pt, Cu, or Ag for example, should cover the topology with a thickness of less than about 3 nm.

The second hard magnet 20 may be constructed from materials similar to that of the first hard magnet 10. In a preferred embodiment, the first hard magnet 10 is an exchange-bias coupled multilayer, such as IrMn/CoFeB/Ru/CoFeB, and the second hard magnet 20 is a ferromagnetic single layer with high coercivity, such as CoFe. In all embodiments, the second hard magnet 20 must have a magnetization direction opposite to that of the first hard magnet 10. The second hard magnet 20 is connected to the bit line 24, shown in FIG. 2 along the y-axis.

The remaining space between the first hard magnet 10 and the second hard magnet 20 and thin metal layer 18 is filled by a dielectric liner. The liner thickness can range from about 50 nm to about 200 nm. In the preferred embodiment, the dielectric is $SiO_2$.

FIGS. 3-11 generally show a process for manufacturing an MRAM device in accordance with the preferred embodiment of the invention.

Figure 3:
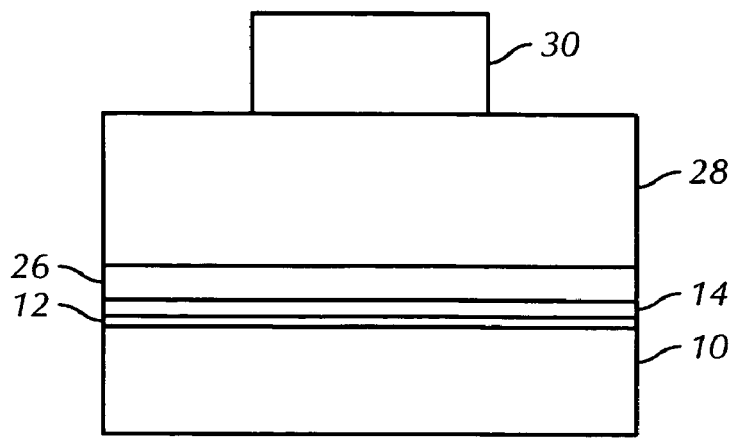

Referring to FIG. 3, the first hard magnet 10, the insulator structure 12, and ferromagnetic free layer 14 are deposited. A CMP stop layer 26 may be metallic or isolated. A hard mask 28 is placed atop the CMP stop layer 26. In the preferred embodiment, the stop layer 26 consists of SiN if the hard mask 28 and later deposited dielectric liner (discussed below) are composed of $SiO_2$ and the slurry of CMP is $CeO_2$. The thickness of the stop layer 26 should be about 10 nm.

In the preferred embodiment, the hard mask 28 is $SiO_2$, and ranges in thickness from about 50 nm to about 300 nm. A patterned resist film 30 also ranges from about 50 nm to about 300 nm in thickness. In the preferred embodiment, the patterned resist film 30 is a pillar shape, such as an ellipse, eye shape, or circular form.

Figure 4:
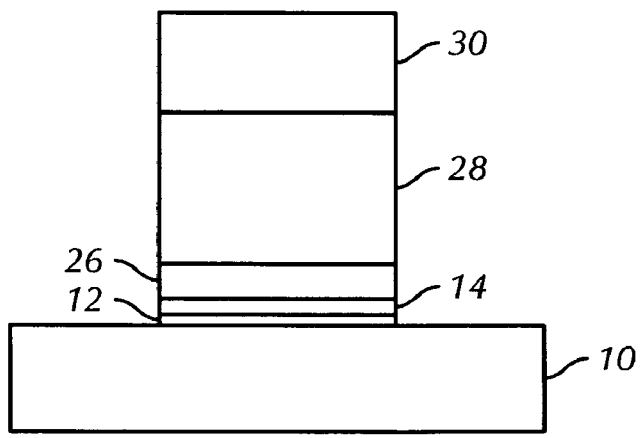

Referring to FIG. 4, the insulator structure 12, the ferromagnetic free structure 14, the CMP stop layer 26, and the hard mask 28 are etched to the patterned resist film 30. A recipe of F-based chemistries can be used to etch the hard mask 28 and the CMP stop layer 26 by reactive-ion-etch (RIE) method. A recipe with multiple steps can then be used to etch the ferromagnetic free structure 14 and the insulator 12. Possible chemistries include $Cl_2$, $BCl_3$, $NF_3$, $CF_4$, $CHF_3$, CO, $O_2$, Ar, and/or $N_2$. In the preferred embodiment, RIE is used. Time mode or end-point detection methods can be used to stop on the first hard magnet 10.

Figure 5:
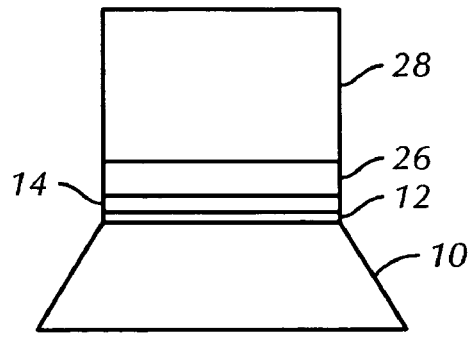

Referring to FIG. 5, the first hard magnet 10 is etched to a taper profile. A passivation dominates RIE recipe using $Cl_2$, $BCl_3$, $NF_3$, $CF_4$, $CHF_3$, CO, $O_2$, Ar, and/or $N_2$ may be used. However, the CO and $O_2$ may be decreased, and $BCl_3$ and $CHF_3$ may be increased. Time mode or end-point detection methods may be used to stop the etching process. To remove the polymers, an $O_2$ plasma strip and wet strip by EKC265 may be utilized.

Referring to FIG. 6, a suitable solvent is used to shrink the hard mask 28 size. In the preferred embodiment, after the shrink, the critical dimension of the hard mask 28 ranges from about 10 nm to about 60 nm. This is down from a pre-shrink size of less than about 150 nm. If a SiN hard mask is used, the solvent may be hot phosphoric acid with time-mode control. In the preferred embodiment, the hard mask is $SiO_2$, and the solvent may be dilute HF or buffer HF with time mode control.

Referring to FIG. 7, the insulator structure 12, ferromagnetic free structure 14, and CMP stop layer 26 are etched again to conform to the shrunken hard mask 28. A multiple-step recipe may be used. For the CMP stop layer 26, possible chemistries include $CF_4$, $CHF_3$, $CH_3F$ CO, $O_2$, Ar, and/or $N_2$. In the preferred embodiment, RIE is used with fine-tuned parameters. Possible chemistries to etch the ferromagnetic free structure 14 and insulator structure 12 include $Cl_2$, $BCl_3$, $NF_3$, $CF_4$, $CHF_3$, CO, $O_2$, Ar, and/or $N_2$. Time mode or end-point detection methods may be used to stop on the first hard magnet 10. In the preferred embodiment, RIE is used with fine-tuned parameters.

Referring to FIG. 8, a thick dielectric liner 16 is deposited over the entire topology. In the preferred embodiment, the dielectric is $SiO_2$ deposited by a method such as chemical vapor deposition (CVD), or Plasma-Enhanced CVD. Referring to FIG. 9, a dielectric topology CMP process is used to expose the CMP stop layer 26 without damaging the ferromagnetic free structure. In the preferred embodiment, the slurry is $CeO_2$ so that the polish selectivity is high enough to stop on the CMP stop layer 26. A number of dummy patterns near the array (not shown in FIG. 9) are required to detect the progress of the polishing. Following the CMP process, a scrubber cleaner is needed to remove particle residue left behind.

Figure 10:
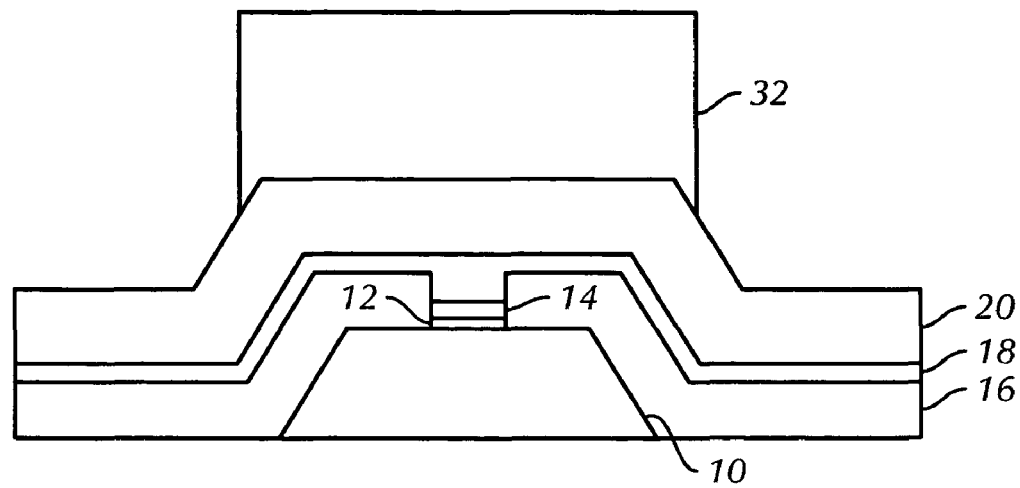

Referring to FIG. 10, the CMP stop layer 26 from FIG. 9 is removed by, for example, wet etch or dry etch. In the preferred embodiment, wet etch by phosphoric acid is employed for a CMP stop layer of SiN. The selectivity of the etching to the ferromagnetic free structure 14 and dielectric liner 16 is sufficient. The thin metal layer 18 is then deposited over the topology. The second hard magnet 20 is deposited over the metal layer 18. The magnetization direction may be induced by applying a magnetic field during deposition. A second patterned resist film 32 is similar to the first patterned resist film 30, in that it is a pillar shape, such as an ellipse, eye shape, or circular form. However, the critical dimension ranges from about 50 nm to about 300 nm and must be larger than the critical dimension of the first hard magnet 10.

Figure 11:
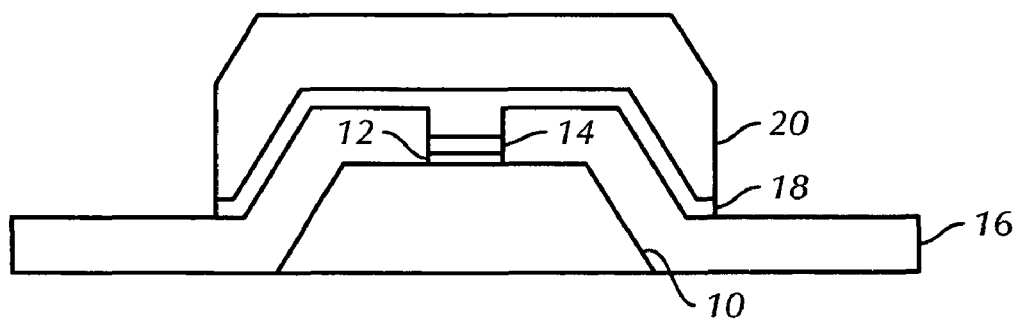

Referring to FIG. 11, a multiple-step recipe may be used to etch the second hard magnet 20 and thin metal layer 18. Possible chemistries include $Cl_2$, $BCl_3$, $NF_3$, $CF_4$, $CHF_3$, CO, $O_2$, Ar, and/or $N_2$. In the preferred embodiment, RIE is used with fine-tuned parameters. Time mode or end-point detection methods may be used to stop on the dielectric liner with the overetch. Following the etching, an $O_2$ plasma strip and wet strip by EKC265 are used to remove all of the polymers.

Figure 12:
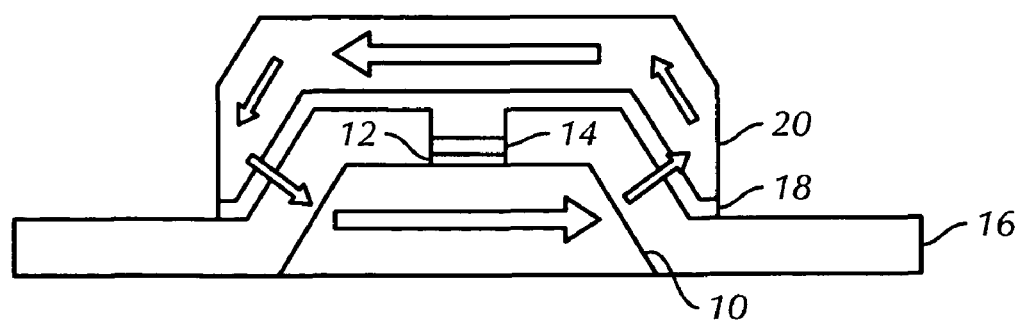
FIG. 12 shows a cross section of an embodiment of the present invention.

FIG. 12 shows the completed memory device with magnetization directions indicated in the first hard magnet 10 and the second hard magnet 20. The opposite magnetization directions and the conforming shape of the two hard magnets 10 and 20 cause the magnetic flux to form a circle loop through the magnets 10 and 20. This loop stabilizes the energy to satisfy Maxwell's second equation of div B=0. This self-stable alignment of the hard magnets 10 and 20 prevents nearby devices from being disturbed by the magnetic flux.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention.

What is claimed is:

1. A nano-magnetic device comprising:
    (a) a first hard magnet having a first magnetization direction and having a central axis;
    (b) a second hard magnet separated from the first hard magnet by a dielectric liner, the second hard magnet having a second magnetization direction opposite to the first magnetization direction of the first hard magnet, and having a central axis; and
    (c) a ferromagnetic free layer having a central axis, such that a spin-torque transfer current passes along the central axes of the first and second hard magnets and the ferromagnetic free layer, and affects the magnetization direction of the ferromagnetic free layer, wherein the second hard magnet has a shape conforming with top and sidewalls of the first hard magnet to enclose top and lateral sides of the ferromagnetic free layer.

2. The nano-magnetic device of claim 1, wherein the ferromagnetic free layer has a coercivity of less than about 50 Oe.

3. The nano-magnetic device of claim 1, wherein the ferromagnetic free layer is CoFe or CoFeB.

4. The nano-magnetic device of claim 1, wherein the first hard magnet is an exchange-bias coupled multilayer ferromagnetic material.

5. The nano-magnetic device of claim 1, wherein the second hard magnet is a ferromagnetic single layer having a coercivity greater than about 100 Oe.

6. The nano-magnetic device of claim 1, further comprising:
    (d) an insulator layer situated between the first hard magnet and the ferromagnetic free layer.

7. The nano-magnetic device of claim 6, wherein the insulator layer is $Al_2O_3$ or MgO.

8. The nano-magnetic device of claim 6, further comprising:
    (e) a thin metal layer contacting the ferromagnetic free layer and the second hard magnet.

9. The nano-magnetic device of claim 8, wherein the thin metal layer is Ru or Ir.

10. The nano-magnetic device of claim 8, wherein the dielectric liner separates the first hard magnet and any portion of the thin metal layer not contacting the ferromagnetic free layer.

11. An plurality of nano-magnetic devices, each nano-magnetic device comprising:
    (a) a first hard magnet having a first magnetization direction and having a central axis;
    (b) a second hard magnet separated from the first hard magnet by a dielectric liner, the second hard magnet having a second magnetization direction opposite to the first magnetization direction of the first hard magnet, and having a central axis; and
    (c) a ferromagnetic free layer having a central axis, such that a spin-torque transfer current passes along the central axes of the first and second hard magnets and the ferromagnetic free layer, and affects the magnetization direction of the ferromagnetic free layer, wherein the second hard magnet has a shape conforming with top and sidewalls of the first hard magnet to enclose top and lateral sides of the ferromagnetic free layer,
    and each device being connected to a chip so as to form an array for use in a magnetic random access memory.

* * * * *